United States Patent [19]

Dursch

[11] Patent Number: 4,703,131

[45] Date of Patent: Oct. 27, 1987

[54] CDS/CUINSE$_2$ SOLAR CELLS WITH TITANIUM FOIL SUBSTRATE

[75] Inventor: Harry W. Dursch, Seattle, Wash.

[73] Assignee: The Boeing Company, Seattle, Wash.

[21] Appl. No.: 799,041

[22] Filed: Nov. 18, 1985

[51] Int. Cl.$^4$ ............................................. H01L 31/06
[52] U.S. Cl. ..................... 136/258; 136/256; 136/260; 136/265; 357/30; 357/59; 357/65; 357/67
[58] Field of Search ................. 136/245, 256, 258 PC, 136/260, 264, 265; 357/30, 59 D, 65, 67

[56] References Cited

U.S. PATENT DOCUMENTS

Re. 31,968 8/1985 Mickelsen et al. .................. 136/260

OTHER PUBLICATIONS

G. Hodes et al., *Thin Solid Films*, vol. 128, pp. 93–106 (Jun. 1985).

*Primary Examiner*—Aaron Weisstuch
*Attorney, Agent, or Firm*—John C. Hammar

[57] ABSTRACT

Increased specific powers are achieved for space solar cells by using 2–5 mil titanium foil as the substrate of a cell. Specific powers above the NASA goal of 300 watts/kg for (Cd,Zn)S/CuInSe$_2$ solar cells have been measured, and specific powers above 500 watts/kg are believed to be achievable.

20 Claims, 2 Drawing Figures

CDS/CUINSE$_2$ SOLAR CELLS WITH TITANIUM FOIL SUBSTRATE

TECHNICAL FIELD

The present invention relates to space solar cells having high specific powers (watts/kg) formed by depositing (Cd,Zn)S/CuInSe$_2$ on titanium foil.

BACKGROUND ART

NASA goals for space power arrays call for specific powers for the array in excess of 300 watts/kg so that the mass and drag of the spacecraft power system will be reduced and so that the spacecraft, then, can carry larger payloads. Because the hardware of the array only reduces the specific power by adding weight without increasing the power, the cells of the array must have specific powers well in excess of 300 watts/kg if the resulting array will achieve the goal.

Mickelsen and Chen describe thin film, polycrystalline, I-II-VI$_2$ semiconductors suitable for space solar cells in U.S. Pat. Re. No. 31,968 and U.S. Pat. No. 4,523,051 (both incorporated by reference). Their CuInSe$_2$/(Cd, Zn)S cells are deposited on relatively thick substrates selected from polycrystalline alumina, glazed alumina, enameled steel, metal foils, and similar inert inorganic materials. Typically, the substrate has a thickness of at least about 25 mils and is preferably either 25 mil alumina or 60 mil soda lime glass. Cells of this type can have efficiencies on the order of 10% AMO, but the specific power of the cells is dramatically reduced by the mass of the substrate.

Presently, silicon solar cells are used for space power applications. I-III-VI$_2$ semiconductor cells, particularly (Cd,Zn)S/CuInSe$_2$, would provide several advantages:

(1) The CuInSe$_2$ cell is only 10 microns thick (without substrate) and, therefore, offers the potential of an extremely high specific power. Conventional silicon cells are 50-100 times thicker.

(2) Radiation testing has shown the CuInSe$_2$ cell to be 50 times more resistant to 1 MeV protons than silicon cells. The CuInSe$_2$ cell also possesses an inherent tolerance to irradiation by 1 MeV electrons up to at least $2 \times 10^{16}$ electrons/cm$^2$. At this fluence, typical silicon cells are degraded by over 50%. Because of the radiation hardness of the CuInSe$_2$ cell, reduced radiation shielding is required with CuInSe$_2$ cells which results in an even higher specific power. By using the equivalent radiation shielding on CuInSe$_2$ cells as on silicon cells, a higher end of life efficiency can be achieved for CuInSe$_2$ as well as a higher specific power.

(3) Annealing of the cell, after proton irradiation, at 200° C. for six minutes restored the CuInSe$_2$ cell to within 95% of its initial efficiency.

The major limiting factor against using CuInSe$_2$ cells for space applications has been a low specific power for the cells primarily caused by the substrate mass. While soda lime glass or alumina substrates are satisfactory for terrestrial applications, the cells deposited on the substrates possess a low specific power. Therefore, a much lighter substrate is required to achieve NASA's goal and to meet the demands for modern space power applications

SUMMARY OF THE INVENTION

The present invention relates to I-III-VI$_2$ semiconductor having a higher specific power than conventional cells and being suitable for use in modern space power applications, and preferably comprising a polycrystalline, thin film (Cd,Zn)S/CuInSe$_2$ semiconductor or transducer on a 2-5 mil titanium metal foil. At photovoltaic conversion efficiencies in the order of 8% AMO (as already achieved for cells using titanium foil substrates), this cell has a specific power in excess of 350 watts/kg. If efficiencies equivalent to those already achieved for (Cd,Zn)S/CuInSe$_2$ on alumina or soda glass are achieved, specific powers in excess of 400 watts/kg will be achievable.

BEST MODE CONTEMPLATED FOR MAKING OR USING THE INVENTION

The solar cell 10 of the present invention preferably is a polycrystalline, thin film, I-III-IV$_2$ chalcopyrite semiconductor, and, more preferably, a p-CuInSe$_2$/n-(Cd,Zn)S heterojunction made according to the method of Mickelsen and Chen in U.S. Pat. Re. No. 31,968 and U.S. Pat. No. 4,523,051 (both incorporated by reference). Briefly, the Mickelsen and Chen method forms a graded, ternary semiconductor free of voids and copper nodules by simultaneous elemental reactive evaporation. The rates of evaporation of the several elements, the substrate temperature, and the reactor pressure are controlled to achieve high efficiency, polycrystalline thin films.

Figure 1:
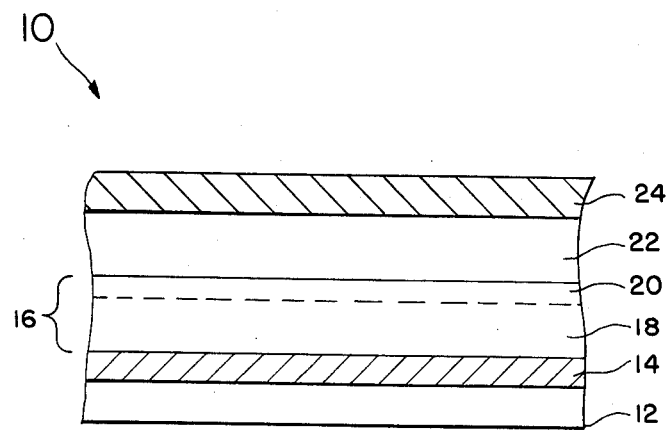
FIG. 1 is a schematic cross-section of a solar cell of the present invention.

As shown in FIG. 1, the cell 10 comprises a 2-5 mil titanium metal foil substrate 12, and, preferably, a 2 mil foil. This foil can withstand the high temperatures necessary for fabricating the cell (450° C. for 20 min) without cracking, melting, softening, or distorting. When cooled, the foil retains its desirable mechanical properties. Titanium foil has a coefficient of thermal expansion that essentially matches that of the CuInSe$_2$/(Cd,Zn)S cell. This match prevents excessive residual stresses or flaking of the cell when cooled to ambient temperature after deposition or during thermal cycling of the cell between about $-175°$ C. to 100° C., as may be experienced in space applications. No outgassing occurs from the substrate during deposition. Finally, and most importantly, the foil provides the possibility of higher specific powers, since titanium, especially at two mils, is as light a substrate as heretofore believed possible. The foil increases the specific power since it reduces the volume of material and exhibits a low density (kg/cm$^3$). Specific powers above 350 watts/kg for completed cells are achievable and possibly as high as 500-1000 watts/kg when the efficiency is optimized.

A thin film base contact 14, preferably of molybdenum, is deposited on the substrate 12 by sputtering. Then, a graded ternary layer 16 of CuInSe$_2$ is deposited by reactive evaporation. Improved semiconductors are formed by controlling the mean free path between vapor particles in the reactor by increasing the pressure to produce a homogeneous mixture, as described in U.S. Pat. No. 4,432,051. As suggested by Walter Devaney of The Boeing Company, the CuInSe$_2$ layer 16 can be further improved by controlling the evaporation rates for Cu and Se independently throughout the deposition and particularly in the initial deposition of CuInSe$_2$ onto the Mo contact 14, in the bulk of the thin film, and in the region near the junction of the film. The substrate temperature should also be controlled throughout the deposition.

The CuInSe$_2$ layer 16 has two different composition graded regions 18 and 20 sequentially formed with one region 18 having a first preselected ratio of the elements in the ternary semiconductor material so as to form a low resistivity semiconductor region and the other region 20 having a different preselected ratio of the elements so as to form a high resistivity, transient semiconductor region. The two regions define a transient homojunction. Essentially, one region 20 is deficient in copper near the photoactive junction while the other region 18 is copper-rich to form a p-n type junction.

While CuInSe$_2$ is preferred for the cell 10, other materials in the I-III-IV$_2$ chalcopyrite semiconductor family might be used, such as a thin-film A-B-type heterojunction where "A" and "B" are selected from the group of semiconductor materials consisting of:

| A | and B |
|---|---|
| i a p-type ternary material | and an n-type material; |
| ii an n-type ternary material | and a p-type material; |
| iii an n-type material | and a p-type ternary material; |
| iv a p-type material | and an n-type ternary material |

These other materials, such as AgInS$_2$, AgGaSe$_2$, or AgGaTe$_2$, as disclosed in U.S. Pat. Re. No. 31,968, may only have limited application in solar cells.

A (Cd,Zn)S layer 22 on the CuInSe$_2$ forms a heterojunction, as explained by Mickelsen and Chen. The resulting cell 10 is a low-cost, polycrystalline transducer having an efficiency of at least about 8-10% AMO and a specific power above the NASA goal of 300 watts/kg.

Figure 2:
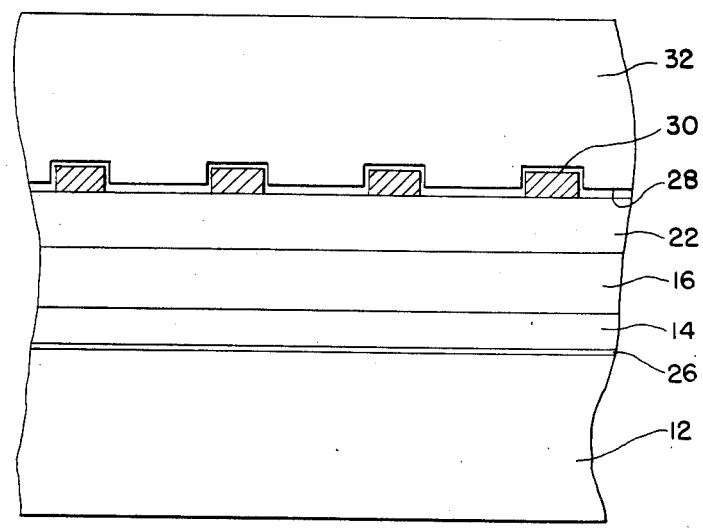
FIG. 2 is a schematic cross-section of another cell.

One or more layers 24 of an antireflection coating can be applied atop the CdS layer 22 to enhance the cell efficiency. SiO$_x$, MgF$_2$, and other conventional antireflection coatings can be used. As shown in FIG. 2, the preferred complete cell 10 also includes a grid contact 30 atop the (Cd,Zn)S and a dielectric film 26 of Si$_3$N$_4$ or of another compatible material between the foil and Mo contact. To provide additional radiation resistance and to environmental stability, and protect the cell array during handling, the cells may be coated with about a 2 mil cover layer of FEP-Teflon, another suitable polymer, or a glass cover layer.

Cells of this general type are particularly suited for use in tandem cells. In a mechanically-stacked tandem cell, where the upper cell has a band gap of about 1.4-1.8 eV, and the bottom cell, a band gap of about 1.0 eV, the upper cell may be silicon, GaAs, CLEFT GaAs, GaAlAs, CLEFT GaAlAs, or a II-VI heterojunction, particularly n-CdSe/p-ZnTe, as suggested by Billy Stanbery of The Boeing Company. The lowest cost with a surprisingly high resistance to radiation damage and with moderately high efficiencies (leading to specific powers in excess of 300 watts/kg for the arrays) are achievable with a CdSe/ZnTe—CuInSe$_2$/(Cd,Zn)S tandem, with the CuInSe$_2$/(Cd,Zn)S being deposited on titanium foil.

The titanium foil substrate can also be used in a monolithic I-III-VI$_2$/II-VI tandem cell, also as suggested by Billy Stanbery. There, the substrate has a Mo contact and a graded CuInSe$_2$ thin film, as in the mechanically-stacked cell previously described. The monolithic cell requires an interface layer so that the lattice mismatch between the CuInSe$_2$ and the upper photoactive layer of the tandem is accommodated, and junctions for the photoactive layers are formed. This interface layer has two regions to make the transition in steps. The first transition region preferably is an n-type ZnSe thin film deposited by low temperature, plasma enhanced CVD at temperatures no greater than about 350° C. to avoid detrimental elemental interdiffusion at the junction. This region is about 0.5-2.0 microns thick, and has degenerate doping with copper in the region away from the photoactive junction with CuInSe$_2$.

Although plasma enhanced deposition is preferred to reduce the deposition temperatures required to grow the films, it is possible to use other enhancement techniques, such as OMCVD or laser technologies, to deposit these films.

Atop the n-ZnSe, a second region of p-ZnTe is deposited by plasma enhanced CVD at low temperatures. This region is about 0.5-3.0 microns thick, and has degenerate doping with phosphorus or copper in the region away from the upper photoactive junction where it contacts the underlying ZnSe surface.

The CuInSe$_2$ to ZnSe lattice mismatch is only about 2.0% and can be eliminated by utilizing CdZnSe. The mismatch between ZnSe/ZnTe is only about 0.4%. Therefore, a graded interface layer of CdZnSe/ZnTe is suitable to interconnect the CuInSe$_2$ active layer to an upper layer of CdSe. If other I-III-VI$_2$ chalcopyrites or II-VI heterojunctions are used in the tandem, the interface connector should be selected to achieve this type of smoothly stepped transition. Furthermore, the interface connector should be transparent to energy passing through the upper photoactive layer.

The ZnSe/ZnTe layer minimizes the propagation of lattice defects from the lower to the upper junction.

Low temperature deposition minimizes dopant redistribution within each region, thereby avoiding undesirable reactions at the film interfaces.

The monolithic cell is completed by depositing n-CdSe, a II-VI semiconductor, in a thin film layer of about 3-5 microns thickness onto the ZnTe region by reactive evaporation, and then by depositing a SnO$_2$:F or ZnO n$^+$-type layer by CVD on the CdSe. One or more layers of an antireflection coating can be applied above the n-type layer to improve cell efficiencies.

EXAMPLE 1

Several 1 cm$^2$ CuInSe$_2$/(Cd,Zn)S cells were deposited on 5 mil titanium foil using standard cleaning and deposition techniques. In cell efficiency testing (without an antireflection coating), these cells exhibited an efficiency of about 7.9% AMO. Stability tests confirmed that the cells were substantially as stable as cells on glass or alumina.

EXAMPLE 2

Hypothetical calculations were made regarding the specific power of a 10% AMO cell using a Si$_3$N$_4$ dielectric 26 (FIG. 2) between the 2 mil substrate 12 and contact 14, an SiO$_x$ antireflection coating 28, an aluminum wire grid 30, and a 2 mil FEP-Teflon cover layer 32. Cells of this type have a specific power in excess of 400 watts/kg.

EXAMPLE 3

Several 1 cm$^2$ CuInSe$_2$/(Cd,Zn)S cells were deposited on 5 mil titanium foil using a modified Mickelsen/Chen process where the concentration of copper was carefully controlled. Cell efficiencies as high as 8.7% AMO were achieved with cells that included an antireflection coating as described in Example 2 resulting in an actual specific power (for a cell analogous to FIG. 2) in excess of 350 watts/kg. These cells also exhibited stability characteristics similar to the cells that are deposited on alumina or glass substrates.

While preferred embodiments have been shown and described, those skilled in the art will readily recognize alterations, variations, or modifications that might be made to the particular embodiments that have been described without departing from the inventive concept. This description, the examples, and the drawings are intended to illustrate the invention, and not to limit it, unless such limitation is necessary in view of the pertinent prior art. Accordingly, the claims should be interpreted liberally in view of this description to protect the preferred embodiments of the invention that have been described and all reasonable equivalents. The claims should only be limited as is necessary in view of the pertinent prior art.

I claim:

1. A lightweight solar cell or photovoltaic transducer particularly suited for space power applications because the cell has a specific power in excess of 300 watts/kg, comprising:
   (a) a 2–5 mil titanium metal foil substrate;
   (b) a base contact deposited over the substrate; and
   (c) a I-III-VI$_2$ photoactive semiconductor deposited on the contact.

2. The cell of claim 1 wherein the contact is molybdenum.

3. The cell of claim 1 wherein the semiconductor is a thin film.

4. The cell of claim 3 wherein the thin film is CuInSe$_2$.

5. The cell of claim 4 further comprising a thin film of (Cd,Zn)S deposited atop the CuInSe$_2$.

6. The cell of claim 5 wherein the CuInSe$_2$ is formed in a graded manner having a copper-rich lower region adjacent the contact and a copper-deficient upper region adjacent the photoactive junction.

7. The cell of claim 6 wherein the CuInSe$_2$ is free of voids and copper nodules and has an efficiency of at least about 7.9% AMO.

8. The cell of claim 7 wherein the CuInSe$_2$/(Cd,Zn)S is deposited according to a method of Mickelsen and Chen described in U.S. Pat. Re. No. 31,968.

9. The cell of claim 8 wherein the CuInSe$_2$/(Cd,Zn)S is deposited according to a method of Mickelsen and Chen described in U.S. Pat. No. 4,523,051.

10. The cell of claim 6 further comprising at least one antireflection coating deposited on the (Cd,Zn)S.

11. The cell of claim 1 further comprising at least one antireflection coating.

12. A lightweight solar cell particularly suited for space power applications because the cell has a specific power in excess of about 350 watts/kg, comprising:
   (a) a 2–5 mil titanium metal foil substrate;
   (b) a thin film contact deposited over the substrate;
   (c) a graded, p-n type CuInSe$_2$ thin film of about 3.5 microns, free of voids and copper nodules, deposited by simultaneous elemental reactive evaporation on the contact at a temperature between about 350°–500° C.;
   (d) a (Cd,Zn)S thin film deposited atop the CuInSe$_2$ and having a thickness of about 2–4 microns; and
   (e) a grid contact atop the (Cd,Zn)S.

13. The cell of claim 12 further comprising at least one antireflection coating on the (Cd,Zn)S.

14. The cell of claim 12 wherein the CuInSe$_2$ has a copper-rich region adjacent the contact and a copper-deficient region adjacent the photoactive junction.

15. The cell of claim 13 wherein the cell efficiency is at least about 7.9% AMO.

16. The cell of claim 13 further comprising a dielectric between the substrate and contact and a cover layer.

17. A solar cell comprising polycrystalline thin film photoactive layers of CuInSe$_2$ and (Cd,Zn)S a 2–5 mil titanium foil substrate, and a base contact between the photoactive layers and the substrate, wherein the cell has a specific power in excess of about 350 watts/kg.

18. The cell of claim 17 further comprising a dielectric layer on the substrate, a wire grid atop the (Cd,Zn)S, at least one antireflection coating atop the (Cd,Zn)S, and a cover layer atop the antireflection coating, wherein the base contact is between the dielectric layer and the photoactive layers.

19. A photovoltaic transducer, comprising:
   (a) a 2–5 mil titanium foil substrate;
   (b) a dielectric deposited on the substrate;
   (c) a base contact deposited on the dielectric; and
   (d) at least one photoactive semiconductor material deposited on the contact.

20. The transducer of claim 19 wherein the substrate and semiconductor material have substantially the same coefficient of thermal expansion.

* * * * *